United States Patent [19]

Gutierrez et al.

[11] 4,008,106
[45] Feb. 15, 1977

[54] METHOD OF FABRICATING III-V PHOTOCATHODES

[75] Inventors: William A. Gutierrez; Herbert L. Wilson, both of Woodbridge; Edward M. Yee, Alexandria, all of Va.

[73] Assignee: The United States of America as represented by the Secretary of the Army, Washington, D.C.

[22] Filed: Nov. 13, 1975

[21] Appl. No.: 631,589

[52] U.S. Cl. ............... 148/172; 148/171; 148/175; 252/62.3 GA; 148/33.5
[51] Int. Cl.² ............ H01L 21/208; H01L 21/205
[58] Field of Search ......... 148/171, 172, 175; 252/62.3 GA

[56] References Cited

UNITED STATES PATENTS

| | | | |
|---|---|---|---|
| 3,429,756 | 2/1969 | Groves | 156/17 |
| 3,692,593 | 9/1972 | Hawrylo et al. | 148/172 |
| 3,914,136 | 10/1975 | Kressel | 148/171 |

*Primary Examiner*—G. Ozaki
*Attorney, Agent, or Firm*—Nathan Edelberg; Milton W. Lee; Robert P. Gibson

[57] ABSTRACT

A method of fabricating high performance transmission mode negative electron affinity III-V compound photocathodes which eliminates recurrent liquid phase epitaxial growth surface defects and solves the "wipe-off" problem incurred during the termination of the growth cycle.

1 Claim, 2 Drawing Figures

METHOD OF FABRICATING III-V PHOTOCATHODES

The invention described herein may be manufactured, used, and licensed by or for the Government for governmental purposes without the payment of any royalty thereon.

BACKGROUND OF THE INVENTION

This invention disclosure pertains to photocathodes and more specifically to the fabrication of transmission mode negative electron affinity III-V photocathodes.

The fabrication of transmission mode photocathodes and particularly those based on Gallium Arsenide (GaAs) has posed a serious problem due to resulting non-uniform and blemished surfaces where liquid phase epitaxial growth techniques are used.

Transmission mode negative electron affinity photocathodes have a wide variety of applications in the area of photodetection particularly imaging devices and photomultipliers. These improved photocathodes, such as shown in FIG. 1, are generally composed of high quality single crystalline layers of III-V compound semiconductors which include a photoemitting layer 13, an intermediate layer 12, an optically transparent substrate window 11, and an antireflection coating 14. Layer 13 is the active layer which converts the incoming photon signal into an electron signal. Layer 12 serves both to passivate the backside of layer 13 and to relieve any lattice constant disparity between layer 13 and window 11. Layer 14 is used to minimize the light reflection loss at the input side of the photocathode. For explanatory purposes only, the following III-V materials have been chosen: GaAs for layer 13, GaAlAs for layer 12, GaP for substrate window 11, and silicon dioxide ($SiO_2$) for layer 14. This particular structure is designated as GaAs/GaAlAs/GaP.

There are currently at least two methods used in forming the transmission GaAs/GaAlAs/GaP photocathode structure shown in FIG. 1. The first method, called the "hybrid technique", consists of growing by liquid phase epitaxy (LPE) an intermediate GaAlAs layer onto a suitably prepared surface of a single crystalline GaP window substrate and then, after polishing and treating the GaAlAs surface, growing on it by vapor phase epitaxy (VPE) the GaAs photoemitting layer. The second method, called the "all LPE technique" consists of growing both the GaAlAs and the GaAs layers onto the GaP seed by LPE. The layers are generally grown in the same-growth cycle without withdrawal from the growth chamber in order to overcome poor nucleation of the GaAs layer which results from oxidation of the GaAlAs surface when exposed to air.

The first method, the "hybrid technique", can currently provide photocathodes with moderately high sensitivity and good image quality over practical surface areas but suffers from at least one major drawback. The minority carrier diffusion length in the VPE GaAs photoemitting layer is generally in the 0.5 to 1.5 micron range at the p-type doping levels required for good electron escape. High diffusion length is one of the key requirements for high sensitivity. The second method, the all LPE technique, provides GaAs layers with diffusion lengths of up to 5 microns but the layers are non-uniform and contain many blemishes. For the ultimate in photocathode sensitivity, the growth of the GaAs photoemitting layer of LPE is preferrable since the layer can be of high electron diffusion length. In addition, the growth of the GaAs layer by LPE allows it to be doped p-type with germanium (Ge). The use of Ge as the dopant could have a significant advantage over zinc (Zn), for example, because of its lower vapor pressure at a given temperature. By using germanium, dopant loss can be minimized during the vacuum heat cleaning cycle. Heat cleaning is an essential photocathode processing step used to obtain an atomically clean surface prior to activation with cesium and oxygen.

In summary, transmission mode photocathodes, of the type GaAs/GaAlAs/GaP with LPE grown GaAs, are excellent in electrical quality and can provide the ultimate in sensitivity but in the past, when they have been grown by the "all LPE technique", they have been neither uniform nor cosmetically suitable for application in practical image sensing devices. The luminous and spectral sensitivity of these photocathodes, when they are activated to negative electron affinity with cesium and oxygen, greatly exceeds that of conventional multialkali types. Their usefulness, however, has been restricted by their poor imaging quality which results from a poor photocathode surface morphology.

A major problem that exists in the growth of GaAs/GaAlAs/GaP photocathodes by the "all LPE technique" is related to the manner in which the GaAlAs intermediate layer nucleates onto the GaP seed crystal. In this particular case, where the materials are not closely lattice matched (i.e. $a_{GaP} = 5.45$A.: $a_{GaAlAs} = 5.66$A.), the LPE grown GaAlAs surface is rippled and blemished. The subsequent GaAs layer then assumes the surface morphology of the underlying growth resulting in a poor photocathode surface. An additional major drawback to the technique is the so called "wipe-off" problem. This occurs when the melt is removed in order to terminate the growth of the GaAs layer. Melt removal, in a sliding boat assembly, is accomplished by the wiping action of the slider which induces a problem when the melt removal process is incomplete. Growth continues in areas where there is residual melt, ultimately resulting in a non-uniform photocathode layer thickness.

The process described in this invention overcomes the major problems that plague both the "hybrid technique" and the "all LPE technique". The two significant differences in manufacturing procedure between the invention process and the "all LPE technique" are as follows:

1. After the LPE growth of GaAlAs on GaP, the sample is removed from the growth chamber and the GaAlAs surface is polished. It is then protected by a VPE grown GaAs nucleating layer.
2. After the growth of the LPE GaAs photoemitting layer onto the protected GaAlAs surface, a GaAlAs protective layer is grown which is later preferentially removed.

Procedure 1 eliminates any surface ripple and/or blemish that results from the LPE growth of GaAlAs on GaP since the surface of the GaAlAs layer can be polished to optical quality. The VPE nucleating layer serves a two fold purpose. Firstly it protects the GaAlAs surface from oxidation and secondly it serves as a nucleating layer for the growth of the LPE GaAs photoemitting layer assuring good wetting of the growth surface and uniform growth. The nucleating layer may either be grown on or completely replaced by the LPE GaAs layer using an etchback technique. The etchback technique is a process used in liquid phase epitaxy (LPE) wherein the surface of the seed crystal substrate is dissolved into the melt to prepare it for regrowth. It has the advantage of removing any defects or impurities associated with the seed crystal surface. In the instant case, it is used to dissolve the VPE layer and regrow a LPE layer. Etchback is accomplished by contacting the seed surface with an undersaturated melt. Undersaturation causes some of the seed surface to dissolve into the melt. The undersaturation condition is effected by either not placing enough source material to saturate the melt at the melt/seed contact temperature or by increasing the temperature of the melt after contact with the seed. In either case, melt saturation is satisfied by dissolution of some of the seed substrate. The amount of dissolution or etchback is determined either by the degree of initial melt undersaturation or the increase in melt temperature. In practice, it is preferrable to completely remove the nucleating layer by etchback prior to the growth of the LPE photoemitting layer in order to insure that the layer is indeed entirely a high quality LPE layer. Procedure 2 is used to overcome the "wiep-off" problem. In this case the GaAlAs protective layer is the final growth layer and hence any residual melt causes non-uniformities only in the GaAlAs protective layer surface. The protective layer is, however, subsequently removed by a preferential etch which does not attack GaAs. Hence, since the growth interface between GaAs and GaAlAs is extremely planar owing to their almost perfect lattice match (i.e. $a_{GaAs} = 5.65A$.: $a_{GaAlAs} = 5.66A$.), the resultant photoemitting surface is perfectly uniform and blemish-free.

The instant development also overcomes the major drawback of the "hybrid technique". The problem of low diffusion length in the hybrid grown structure is overcome by the use of a LPE grown photoemitting layer.

SUMMARY OF THE INVENTION

The present invention effectively overcomes the disadvantages inherent in the prior art of photocathode fabrication techniques while encompassing all the advantages thereof. The general purpose of this invention lies in the fabrication of III-V photocathodes of high quality material and near perfect surfaces utilizing a liquid phase epitaxial growth scheme interrupted by a vapor phase epitaxial nucleation growth step. More specifically, after growth of the intermediate layer on a substrate window by liquid phase epitaxy, a thin emitter nucleation layer is grown by vapor phase epitaxy. This is followed by sequential growth of the emitting layer and a protective, termination, layer by liquid phase epitaxy.

BRIEF DESCRIPTION OF DRAWINGS

The exact nature of this invention will be readily apparent from consideration of the following specification relating to the annexed drawings wherein.

DESCRIPTION OF THE INVENTION

Figure 1:
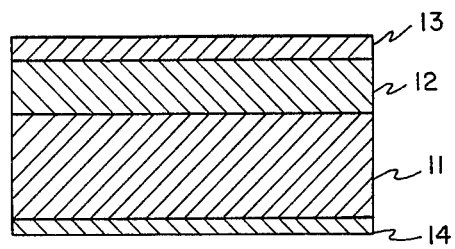
FIG. 1 shows one embodiment of a transmission mode negative electron affinity III-V photocathode.
Figure 2:
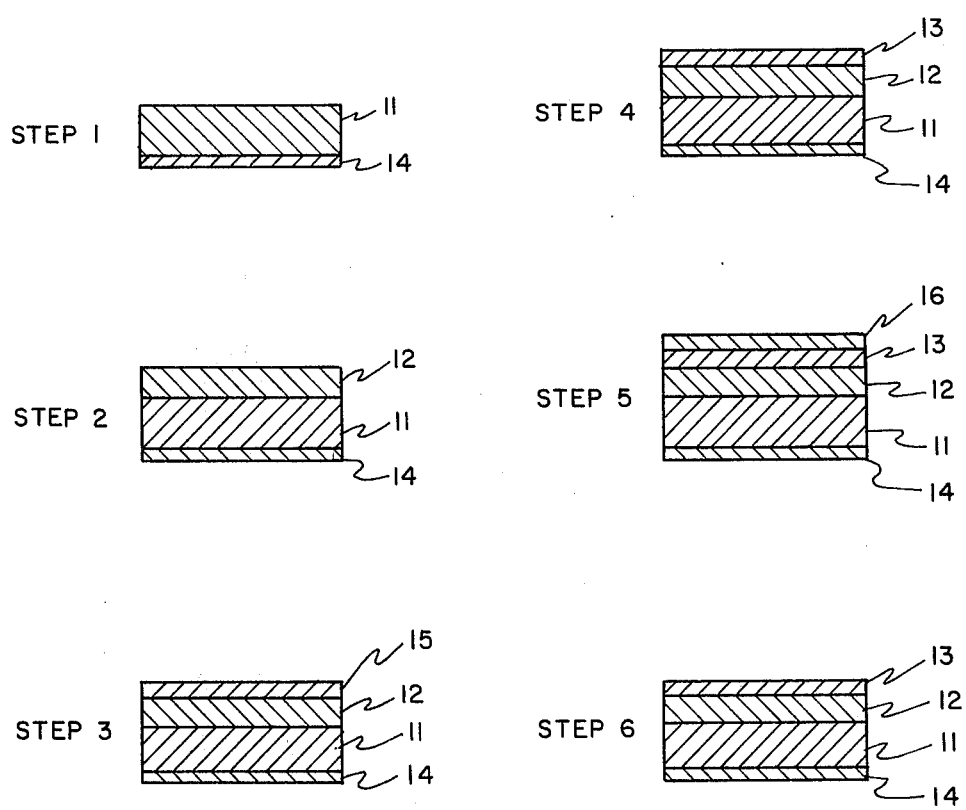
FIG. 2 shows the several steps encountered in the fabrication of a photocathode such as that shown in FIG. 1.

The various steps envisioned in this invention for the fabrication of a transmission mode photocathode can best be understood by reference to FIG. 2 while reviewing the following example method of forming a GaAs/GaAlAs/GaP transmission mode photocathode.

Step 1 consists of applying an appropriate antireflection coating 14 to the (111) A optically polished surface of a single crystal gallium phosphide (GaP) substrate window 11. The antireflection coating 14 (i.e., silicon dioxide, silicon nitride, or suitable multilayer composites) may be applied by any well known technique, such as by chemical vapor deposition, RF sputtering or vacuum evaporation, to the desired thickness. The GaP crystal may be any reasonable size but is generally chosen to be between 18-25 mm in diameter and between 15-200 mils in thickness.

Step 2 consists of preparing by any of several well known methods, such as by chemical polishing, the (111)B crystallographic face of the seed crystal 11 for the liquid phase epitaxial (LPE) growth of a gallium aluminum aresenide (GaAlAs) intermediate layer 12 to a thickness of from 1 to 3 mils. The LPE technique may employ any of a number of conventional methods such as dipping, tipping or sliding. The GaAlAs layer is generally doped p-type with zinc to a level of approximately $5 \times 10^{17}$ cm$^{-3}$ in order to provide proper passivation of the subsequently grown photoemitting layer 13 of gallium arsenide.

Step 3 consists of polishing the surface of layer 12 to optical quality, again by well known techniques, and then growing onto the polished surface by vapor phase epitaxy (VPE) on a protective gallium arsenide (GaAs) nucleating layer 15 about 0.5 to 3 microns in thickness. The VPE is again well known in the art.

Step 4 consists of growing the gallium arsenide (GaAs) photoemitting layer 13 by liquid phase epitaxy after layer 15 has been removed by any well known etchback technique immediately prior to the LPE growth cycle. Layer 13 is grown to a thickness falling between 0.5 to 3 microns and is doped p-type with either germanium (Ge) or zinc to lie within the range of $(0.1 \text{ to } 1) \times 10^{19}$cm$^{-3}$. Ge is the preferred dopant due to its lower vapor pressure.

Step 5 consists of growing a GaAlAs protective layer 16 onto layer 13 by LPE. The growths of layers 13 and 16 are carried out during the same LPE growth cycle and for this reason it is desirable to use a multiple bin sliding boat LPE growth system designed for multilayer growth, which is also a well known technique. Layer 16 is generally grown to a thickness of about 5 to 20 microns.

Step 6 consists of removing layer 16 from layer 13 using a solution such as HF or HCl that preferentially chemically etches GaAlAs from GaAs. Since the solution does not chemically etch GaAs, layer 16 can be removed from layer 13 leaving the surface of layer 13 planar, specular, and blemish-free.

The photocathode is then made electron emitting by activating the surface of layer 13 to a state of negative electron affinity, which is accomplished by heat cleaning under high vacuum conditions and applying monolayer amounts of cesium and oxygen by well known techniques until a peak in photosensitivity is reached.

It should be understood, that the foregoing disclosure only relates to certain preferred embodiments and processes while it will be apparent to those skilled in the art that variations in specific details may be resorted to without departing from the spirit and scope of the invention as set forth in the appended claims.

We claim:

1. A method of fabricating a III–V compound transmission mode photocathode comprising the steps of:

preparing a single crystal III–V compound substrate window for epitaxial growth by chemically polishing the growth surface;

growing by liquid phase epitaxy an intermediate III–-III–V compound layer onto the prepared surface of the seed crystal;

optically polishing the exposed surface of the resultant intermediate layer;

protecting the polished surface of the intermediate layer by the vapor phase epitaxial growth of a nucleating layer of III–V material thereon;

removing the nucleating layer by an etchback technique immediately prior to growing by liquid phase epitaxy a III–V photoemitting layer upon the nucleated surface of the intermediate layer;

growing a liquid phase epitaxy III–III–V compound protective layer upon the photoemitting layer during the same growth cycle but at the termination of the growth of the emitting layer;

preferentially chemically removing the III–III–V compound protective layer from the emitting layer; and activating the surface of the electron emitting layer to a state of negative electron affinity, thereby effecting a functional photocathode.

* * * * *